(12) United States Patent
Ding et al.

(10) Patent No.: US 10,491,224 B2
(45) Date of Patent: Nov. 26, 2019

(54) WAKEUP TIMER USING BANG-BANG DIGITAL-INTENSIVE FREQUENCY LOCKED-LOOP

(71) Applicants: Stichting IMEC Nederland, Eindhoven (NL); Technische Universiteit Delft, Delft (NL)

(72) Inventors: Ming Ding, Eindhoven (NL); Zhihao Zhou, Eindhoven (NL); Yao-Hong Liu, Eindhoven (NL); Fabio Sebastiano, Delft (NL)

(73) Assignees: Stichting IMEC Nederland, Eindhoven (NL); Technische Universiteit Delft, Delft (NL)

( * ) Notice: Subject to any disclaimer, the term of this patent is extended or adjusted under 35 U.S.C. 154(b) by 0 days.

(21) Appl. No.: 16/280,699

(22) Filed: Feb. 20, 2019

(65) Prior Publication Data

US 2019/0268007 A1    Aug. 29, 2019

Related U.S. Application Data

(60) Provisional application No. 62/636,049, filed on Feb. 27, 2018.

(51) Int. Cl.
| | |
|---|---|
| *H03L 7/06* | (2006.01) |
| *H03L 7/093* | (2006.01) |
| *H03L 7/099* | (2006.01) |

(52) U.S. Cl.
CPC .............. *H03L 7/093* (2013.01); *H03L 7/099* (2013.01)

(58) Field of Classification Search
CPC ...................................................... H03L 7/093

USPC .................................. 327/147–149, 156–158
See application file for complete search history.

(56) References Cited

U.S. PATENT DOCUMENTS

| | | | | |
|---|---|---|---|---|
| 6,633,201 B1 * | 10/2003 | Milton | ..................... | H03L 7/087 327/156 |
| 7,741,928 B1 * | 6/2010 | Cousinard | .............. | H04B 1/034 331/23 |
| 8,536,916 B1 * | 9/2013 | van Engelen | ........... | H03L 7/099 327/150 |
| 8,773,182 B1 * | 7/2014 | Degani | .................... | H03L 7/085 327/147 |
| 9,344,098 B1 * | 5/2016 | Sfikas | ...................... | H03L 7/093 |
| 2005/0030001 A1 * | 2/2005 | Jasa | ....................... | H03L 7/087 324/76.53 |

(Continued)

*Primary Examiner* — Adam D Houston
(74) *Attorney, Agent, or Firm* — McDonnell Boehnen Hulbert & Berghoff LLP

(57) ABSTRACT

The present disclosure describes systems and methods to provide a digital wakeup timer with reduced size and lower power. An example system or apparatus includes a wakeup timer employing a digital-intensive frequency-locked loop (DFLL) architecture to fully utilize the advantages of advanced CMOS processes. Such a system includes a bang-bang frequency detector, a digital loop filter, a digitally-controlled oscillator (DCO), and a multi-phase clock generator. An output of the bang-bang frequency detector is provided to an input of the digital loop filter. An output of the digital loop filter is provided to the DCO. An output of the DCO includes information indicative of an output frequency. The multi-phase clock generator provides respective clock signals based on the output frequency to the bang-bang frequency detector, the digital loop filter, and the DCO.

20 Claims, 14 Drawing Sheets

(56) References Cited

U.S. PATENT DOCUMENTS

| | | | |
|---|---|---|---|
| 2005/0046490 A1* | 3/2005 | Jasa | H03L 7/087 |
| | | | 331/25 |
| 2009/0208226 A1* | 8/2009 | Gao | H03L 7/089 |
| | | | 398/202 |
| 2010/0026352 A1* | 2/2010 | Jacobowitz | H03L 7/0996 |
| | | | 327/158 |
| 2012/0069712 A1* | 3/2012 | Potanin | G01S 7/003 |
| | | | 367/98 |
| 2012/0161826 A1* | 6/2012 | Aas | H03L 1/00 |
| | | | 327/147 |
| 2012/0177159 A1* | 7/2012 | Kong | H03L 7/07 |
| | | | 375/359 |
| 2015/0022272 A1* | 1/2015 | Felix | G06F 1/08 |
| | | | 331/17 |
| 2017/0163267 A1* | 6/2017 | Guinea Trigo | H03L 7/0807 |
| 2019/0089363 A1* | 3/2019 | Miro Panades | G06F 1/08 |

* cited by examiner

| Architecture | This work DFLL | Relaxation oscillator | Relaxation oscillator | Analog FLL | Analog FLL | Capacitive discharging | RC oscillator | Relaxation oscillator |
|---|---|---|---|---|---|---|---|---|
| Process (nm) | 40 | 65 | 65 | 180 | 180 | 250 | 65 | 90 |
| Frequency (Hz) | 417k | 1350k | 18.5k | 3K | 70.4k | 6.4k | 33k | 100k |
| VDD (V) | | 1.4 | 1 | 0.85 - 1.4 | 1.3 | 0.8 | 1.15 - 1.45 | 0.8 |
| Power (nW) | 181 | 920 | 130 | 4.7 | 110 | 75.6 | 190 | 280 |
| Freq. Var. to VDD (%) | ±0.6 @ 0.65-0.8V | ±0.54@ 0.9-2.0V | <±0.25@ 0.95-1.05V | ±0.14@ 0.85-1.4V | ±0.23@ 1.2-1.8V | ±0.27@ 0.6-0.9V | <±0.14@ 1.15-1.45V | ±0.3@ 0.5-1.0V |
| TC (ppm/°C) | 106 @ -20-80°C | 96@ 0-145°C | 85@ -40-90°C | 13.8@ -25-85°C | 34.3@ -40-80°C | 144@ -20-80°C | 38@ -20-90°C | 105@ -40-90°C |
| Allan Deviation Floor (ppm) | | - | 20(>100s) | 63(>100s) | 7(>12s) | 60 (>100s) | 4 (>2s) | - |
| Energy/Cycle (pJ/Cycle) | | 0.68 | 6.5 | 1.6 | 1.56 | 11.8 | 5.6 | 2.8 |
| Area (mm²) | 0.07 | 0.005 | 0.032 | 0.5 | 0.26 | 1.08 | 0.015 | 0.12 |

Figure 12

WAKEUP TIMER USING BANG-BANG DIGITAL-INTENSIVE FREQUENCY LOCKED-LOOP

CROSS REFERENCE TO RELATED APPLICATION

This disclosure claims priority to U.S. Provisional Patent Application Ser. No. 62/636,049, filed on Feb. 27, 2018, which is hereby incorporated by reference herein in its entirety.

FIELD OF THE DISCLOSURE

The present disclosure relates to a wakeup timer using a bang-bang digital-intensive frequency locked-loop, which utilizes a long-term stability enhancement technique.

BACKGROUND

Remote wireless sensor nodes for the Internet of Things (IoT) rely on duty-cycling to achieve extremely low average power consumption. However, these approaches generally require an accurate wakeup timer. Such a timer should avoid off-chip components, such as quartz crystals and occupy minimal area so as to save costs and reduce module size. The wakeup timer should also consume ultra-low power (<1 µW), since it is continuously active, while operating at a low supply voltage for compatibility with a wide range of energy sources (e.g., button batteries, energy scavengers, etc.) and to simplify power management. Because of size and power limitations, RC oscillators are a conventional choice. However, the frequency stability of RC relaxation oscillators is limited by the delay of power-hungry continuous-time comparators, which are vulnerable to process, voltage, and temperature (PVT) variations. Oscillators based on frequency-locked loops (FLL) circumvent such limitations, but they generally rely heavily on analog-intensive circuits (e.g., OP-AMP), which require significant power, area and a high supply voltage. Hence, such approaches are not amenable to technology scaling in terms of area and required supply voltage.

SUMMARY

The present disclosure describes systems and methods that make it possible to overcome the above-described problems. Namely, an example system or apparatus includes a wakeup timer employing a digital-intensive frequency-locked loop (DFLL) architecture to fully utilize the advantages of advanced complementary metal-oxide-semiconductor (CMOS) processes. Such an approach provides low area, low power, and low supply voltage. The proposed wakeup timer achieves the best energy efficiency (~0.43 pJ/cycle) at the lowest supply voltage (~0.7 V) over conventional systems while maintaining excellent on-par long-term stability (Allan deviation floor below ~20 ppm) in a small area (0.07 mm$^2$ in 40 nm CMOS). These advances are enabled by the use of a bang-bang DFLL architecture employing a chopped dynamic comparator and a low-power high-resolution self-biased Sigma Delta digitally-controlled oscillator (DCO).

In a first aspect, a system is provided. The system includes a bang-bang frequency detector, a digital loop filter, a digitally-controlled oscillator (DCO), and a multi-phase clock generator. An output of the bang-bang frequency detector is provided to an input of the digital loop filter. An output of the digital loop filter is provided to the DCO. An output of the DCO comprises information indicative of an output frequency. The multi-phase clock generator provides respective clock signals based on the output frequency to the bang-bang frequency detector, the digital loop filter, and the DCO.

BRIEF DESCRIPTION OF THE FIGURES

The above, as well as additional, features will be better understood through the following illustrative and non-limiting detailed description of example embodiments, with reference to the appended drawings.

FIG. 12 illustrates a performance summary and comparison table, according to an example embodiment.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

1. Timer Architecture

Figure 1:
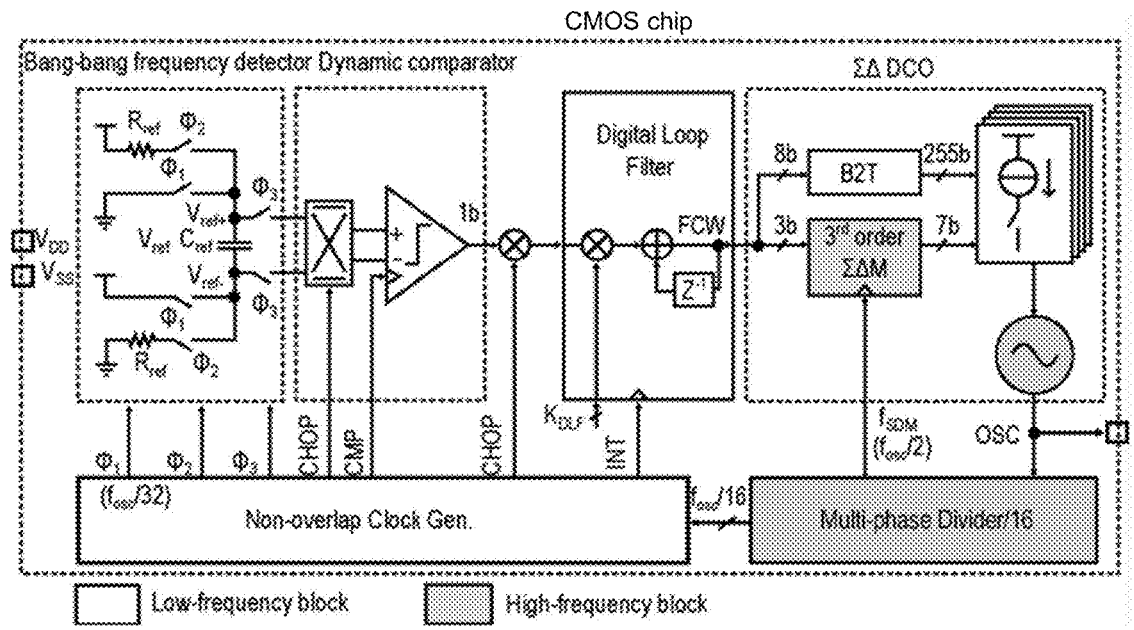
FIG. 1 illustrates an architecture of a digital frequency locked-loop (DFLL) wakeup timer, according to an example embodiment.
Figure 2:
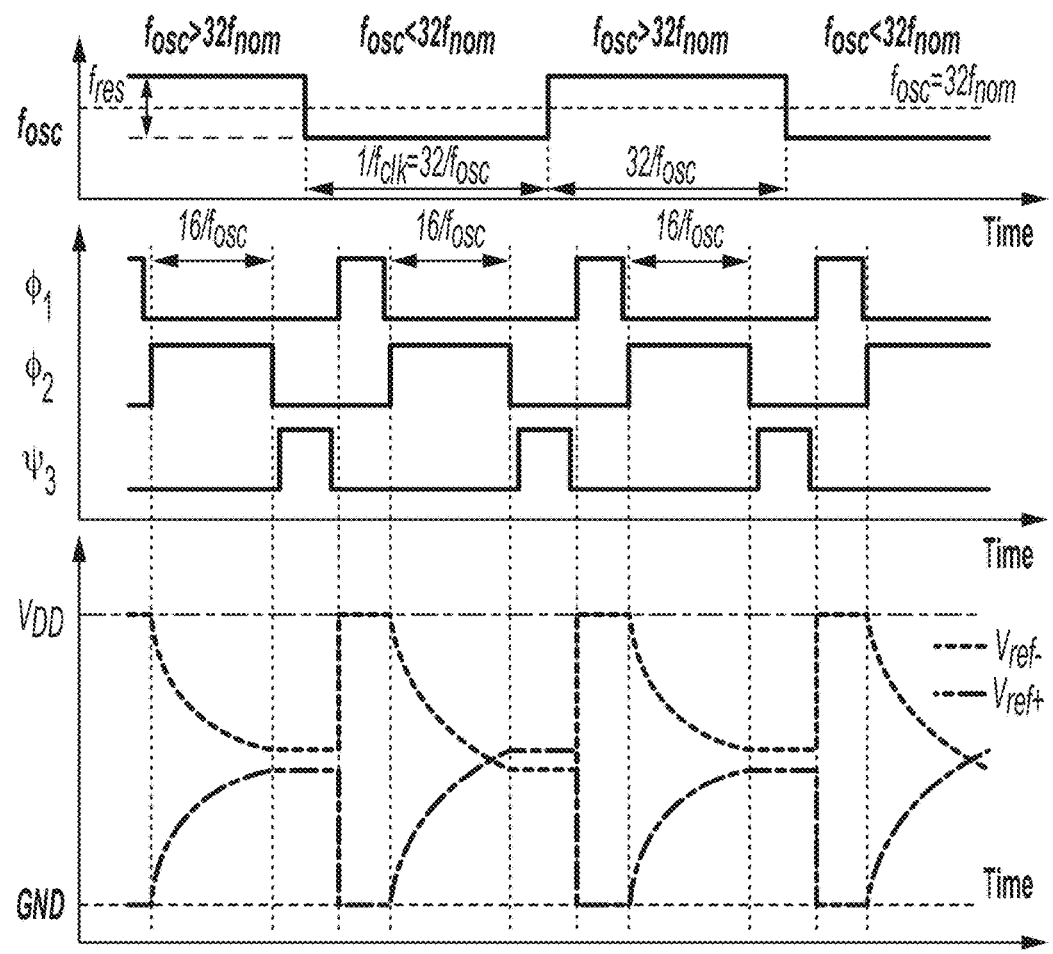
FIG. 2 illustrates a timing diagram of the DFLL and its frequency locking behavior, according to an example embodiment.

The architecture of the proposed DFLL and its timing diagram are shown in FIG. 1 and FIG. 2, respectively. A differential frequency detector (FD) is driven at a clock frequency $f_{clk}=f_{osc}/32$ derived from the output frequency of the DCO $f_{osc}$. The capacitor $C_{ref}$ is charged to $V_{ref}=V_{ref+}-V_{ref-}=V_{DD}$ during phase $\Phi_1$ and discharged via resistors $R_{ref}$ during phase $\Phi_2$. At the end of $\Phi_2$, the output of the FD $V_{ref}=V_{DD}[1-2e^{-1/(4R_{ref}C_{ref}f_{clk})}]$ indicates the relation between the clock frequency $f_{clk}$ and the FD nominal frequency $f_{nom}=1/(4R_{ref}C_{ref}\ln 2)$. For example, $V_{ref}$ will be positive if $f_{clk}<f_{nom}$ and negative otherwise (FIG. 2). The differential circuit topology of the FD ensures a high immunity against supply and ground noise. The sign of $V_{ref}$ is detected by a dynamic comparator and is further processed by a digital loop filter driving the DCO in a negative feedback to ensure that, on average, $V_{ref}=0$ and, hence, $f_{osc}/32=f_{nom}$.

The only analog components in the DFLL are a switching passive RC network for the FD, a comparator and a DCO. As described elsewhere herein, such analog circuits can be implemented using switches and inverter-based structures, so that they can be easily integrated in a nanometer CMOS process with a low power consumption, a low supply voltage and a small area.

II. Circuit Implementation

The DFLL output frequency is set to $f_{osc,nom}=32f_{nom}=8/(R_{ref}C_{ref}\ln 2)\approx 417$ kHz with $R_{ref}=5.5$ MΩ and $C_{ref}=5$ pF chosen for minimum die area occupation/substrate size. The resistor $R_{ref}$ is implemented by a series combination of non-silicided p-poly and n-poly resistors with opposite temperature coefficients (TC) to provide a first-order compensation of the TC of $f_{osc}$. Both $R_{ref}$ and $C_{ref}$ are implemented as switchable arrays that can be digitally tuned to compensate for process spread.

The DCO output frequency is fed into a multi-phase clock divider to provide all the clocks required in this self-clocked FLL (FIG. 2). The large adopted frequency division factor (32×) is advantageous: $\Phi_2$ and, consequently, the output frequency ($f_{osc}$) can be accurately set thanks to the availability of multiple phases; moreover, most of the circuit in FIG. 1 runs at a much lower frequency, thus saving power. For example, a fixed and relatively long comparator delay ($\approx 4.8$ μs) can be allowed compared to the ~ns delay of continuous-time comparators, thus enabling the comparator to be optimized for power instead of speed. A longer comparator delay is allowed in this architecture, since $f_{osc}$ only depends on the duration of $\Phi_2$. The main drawback of running the loop filter at a lower frequency is an increase in the loop settling time.

Unlike traditional RC relaxation oscillators requiring continuous-time comparators, the comparator is implemented as a dynamic StrongARM latch. However, the offset of the comparator may degrade the accuracy of the wakeup timer and introduce a temperature-dependent frequency error, while its flicker noise directly affects the long-term stability of the timer. To suppress the effect of both offset and flicker noise, the dynamic comparator is chopped at a frequency of $f_{osc}/256$ by means of an analog and a digital modulator at the comparator input and output, respectively.

The digital loop filter (FIG. 1) comprises a configurable gain (KDLF in FIG. 1) and a digital accumulator which, thanks to the comparator output being single-bit, are implemented in a compact and low-power form by a bit-shifter and an up/down counter, respectively. By changing the digital filter gain, the overall bandwidth of the DFLL can be easily configured and more reliably predicted than in conventional analog FLL's, which are more vulnerable to PVT variations. This feature allows the DFLL to flexibly trade-off bandwidth and noise for different IoT scenarios. For example, applications dealing with fast temperature or supply changes prefer a higher loop gain, which results in wider loop bandwidth; instead, applications requiring a lower period jitter need a lower loop gain to minimize the DCO step that would otherwise show as additional jitter.

Due to the bang-bang operation of the DFLL, the DCO output frequency will continuously toggle in the steady state.

Figure 3:
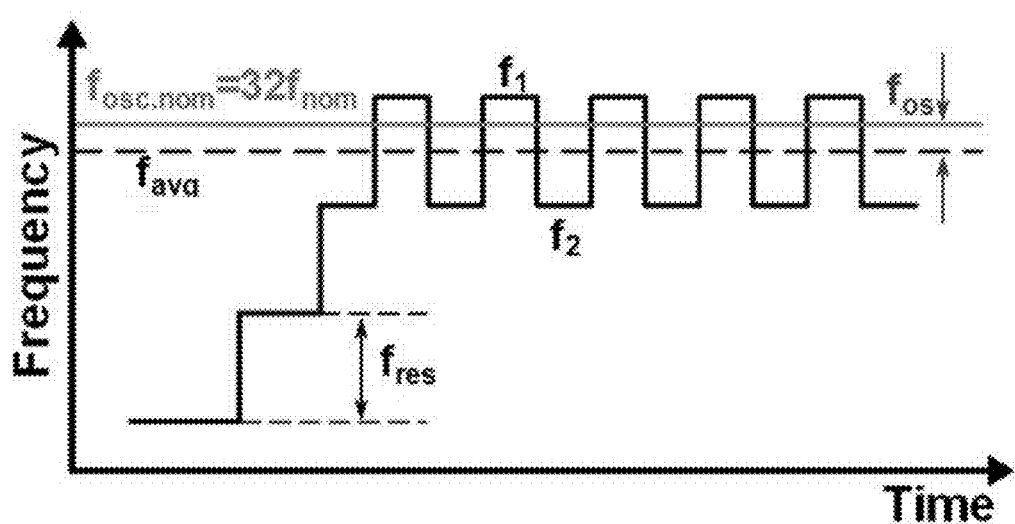
FIG. 3 illustrates frequency error due to finite resolution of a digitally-controlled oscillator (DCO), according to an example embodiment.

If the random noise in the loop is neglected, the DCO control word will toggle between two consecutive values corresponding to the frequencies $f_1$ and $f_2$ that straddle $f_{nom}$, as shown in FIG. 3. Since such locking condition is satisfied for any $f_{nom}$ between $f_1$ and $f_2$, this would result in a worst-case frequency offset $|f_{os}|<(f_1-f_2)/2=f_{res}/2$, where $f_{res}$ is the DCO resolution.

Figure 4:
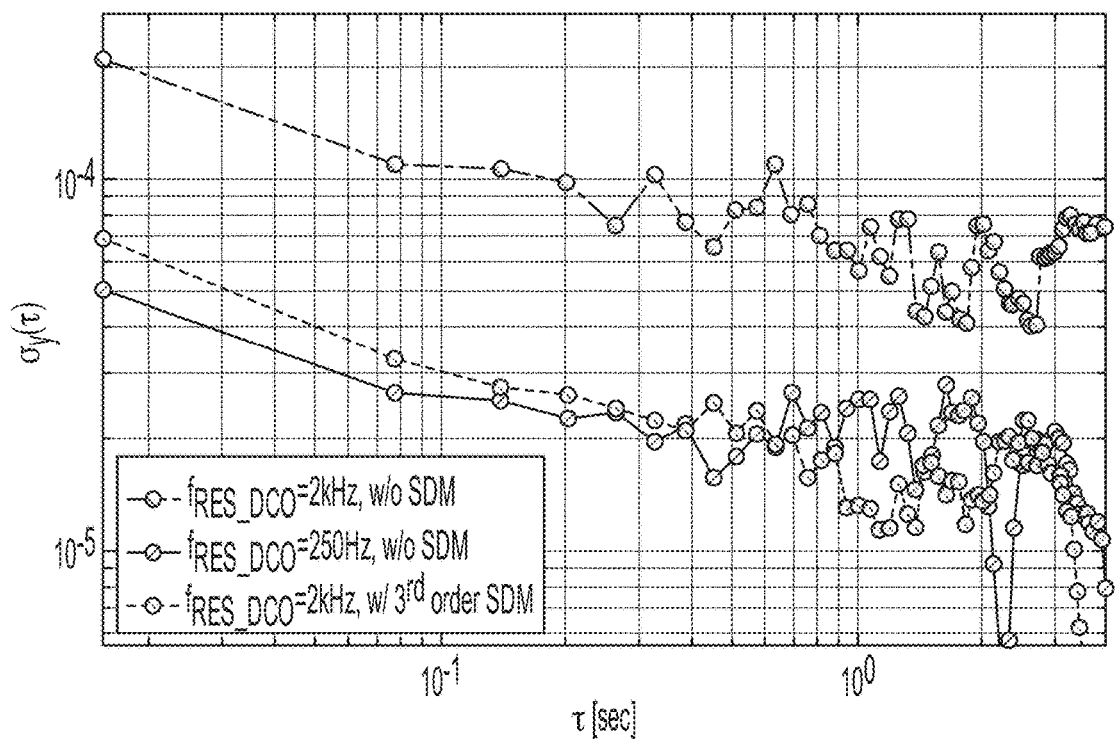
FIG. 4 illustrates the Allan deviation for a DCO operating at 2 kHz with Sigma Delta Modulation (SDM) and DCO operating at 2 kHz and 250 Hz frequency resolutions without SDM, according to example embodiments.

Although this source of inaccuracy is partially mitigated by the dithering effect of random noise, care has been taken to maximize the DCO resolution not to degrade the timer accuracy. Moreover, although the DCO noise is high-pass filtered by the loop and hence does not affect the timer long-term stability, the long-term stability is also affected by the DCO resolution. FIG. 4 shows the simulated Allan deviation for different DCO resolutions, thus demonstrating that a lower $f_{res}$ leads to a lower Allan deviation floor, i.e. a better long-term stability. This effect can be intuitively explained as follows. A higher DCO resolution causes less quantization noise to be injected in the loop. In the equivalent linear model of the loop, this directly affects the equivalent gain of the single-bit comparator. A decrease in noise implies a smaller signal at the comparator input and, hence, a higher equivalent comparator gain. The higher comparator gain reduces the output jitter due to noise in both the comparator and the DCO.

Figure 5:
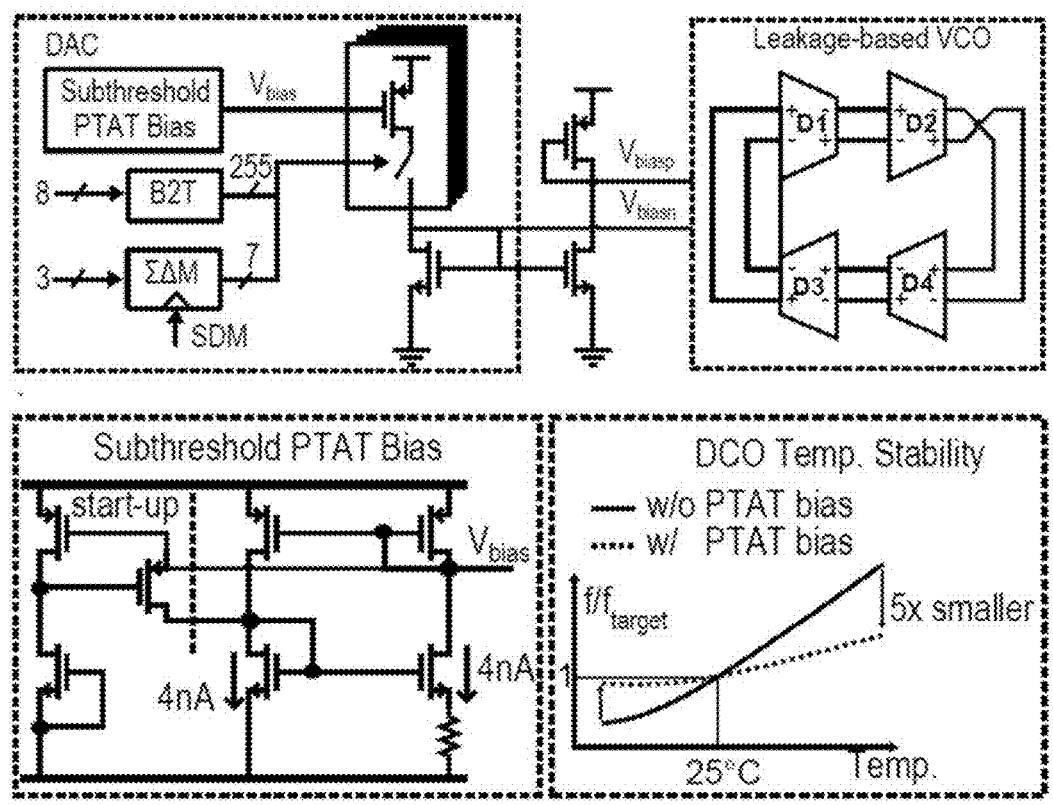
FIG. 5 illustrates a self-biased Sigma Delta DCO, according to an example embodiment.

Consequently, $f_{res}=250$ Hz was chosen for the DCO. Meanwhile, sufficient tuning range for the DCO is required to tackle its frequency drift over PVT. Therefore, a high-resolution DCO is required, which is challenging with the very limited power budget in the wakeup timer (<<1 μW). To address this challenge, two techniques are employed (FIG. 5): temperature compensation facilitated by a local proportional-to-absolute-temperature (PTAT) current bias, and a ΣΔ DAC to improve the DCO resolution. A 4-stage differential ring oscillator employing an ultra-low-power leakage-based delay cell is adopted to keep the oscillator power below 60 nW (FIG. 5). A subthreshold PTAT current bias is used to lower the DCO temperature drift while exploiting a nW oscillator topology. This effectively reduces the oscillator temperature drift by 5×, thus relaxing the DAC design. The self-clocked ΣΔ DAC consists of 255+7=262 unary-coded elements driven by an 8-b integer thermometric DAC clocked at $f_{osc}/32$ and a 3-b fractional DAC processed by a 3rd-order digital ΣΔ modulator. Thanks to the feedback loop, no strict linearity requirements are required for the DAC other than the monotonicity necessary for loop stability. Monotonicity is ensured by the unary nature of the DAC. The ΣΔ modulator is clocked at $f_{osc}/2$ (16× oversampling ratio) to further improve the DCO resolution from 2 kHz to below 250 Hz. The enhancement in resolution given by the ΣΔ operation improves the Allan deviation floor in the same way as a standard DCO with the same equivalent resolution, as illustrated in FIG. 4.

III. Measurements

Figure 6:
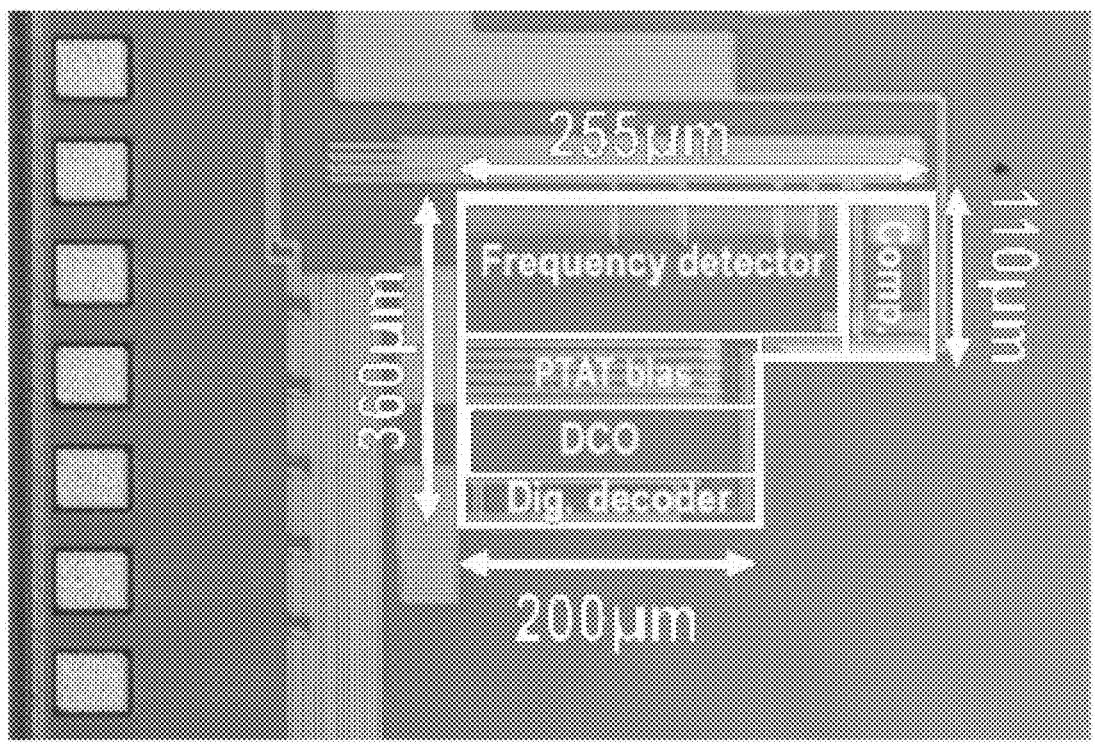
FIG. 6 illustrates a micrograph, according to an example embodiment.

The 0.07-mm² wakeup timer was fabricated in a standard TSMC 1P5M 40-nm CMOS process (FIG. 6) and draws 259 nA from a single 0.7-V supply (power breakdown: 32%

FD/comparator, 38% digital, 30% DCO). This corresponds to a state-of-the-art energy efficiency 0.43 pJ/cycle.

Figure 7A:
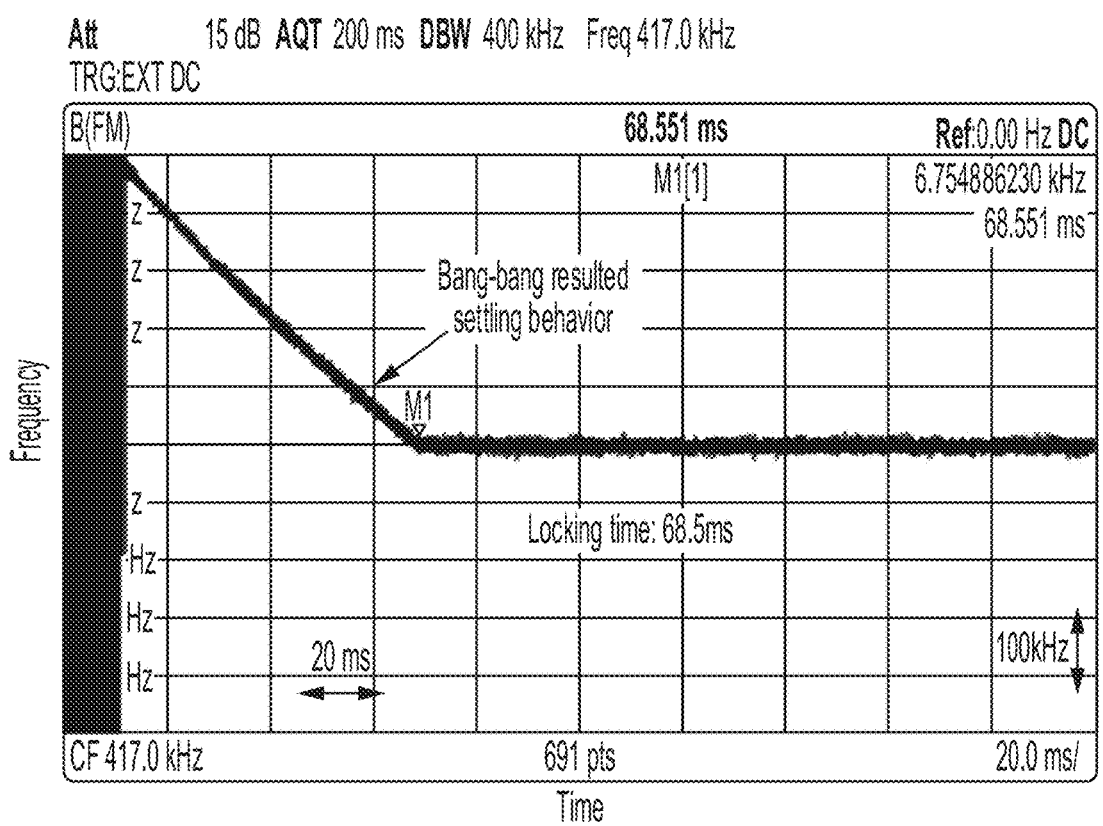
FIG. 7A illustrates a measured DFLL settling waveform ($K_{DLF}=\frac{1}{8}$), according to an example embodiment.
Figure 7B:
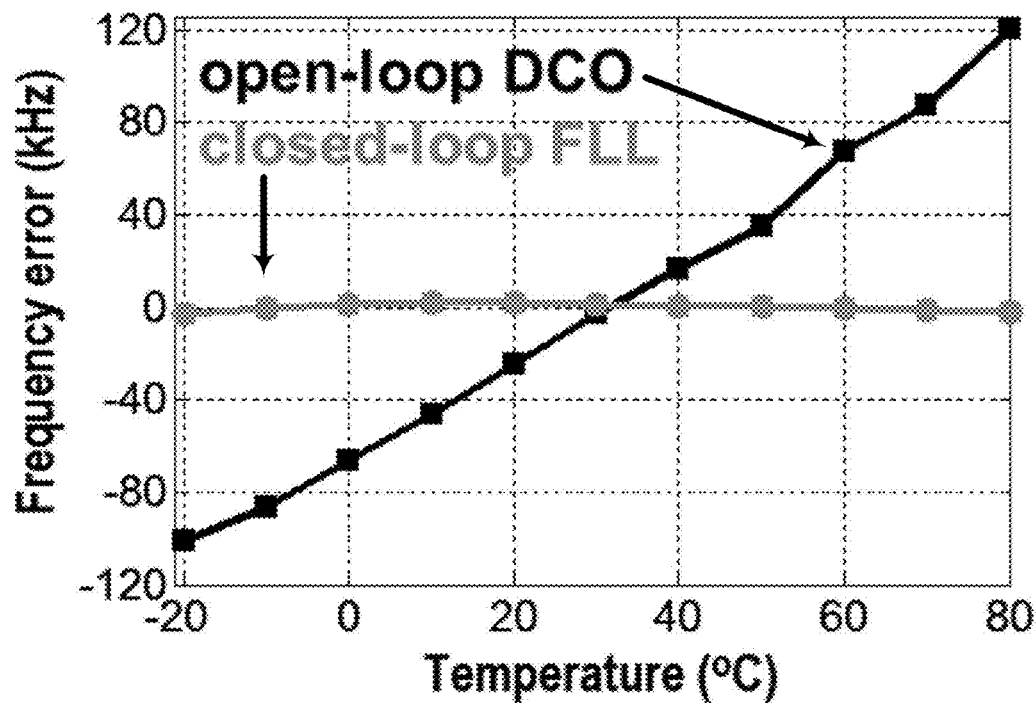
FIG. 7B illustrates frequency error for open-loop DCO and closed-loop FLL operation, according to an example embodiment.
Figure 8:
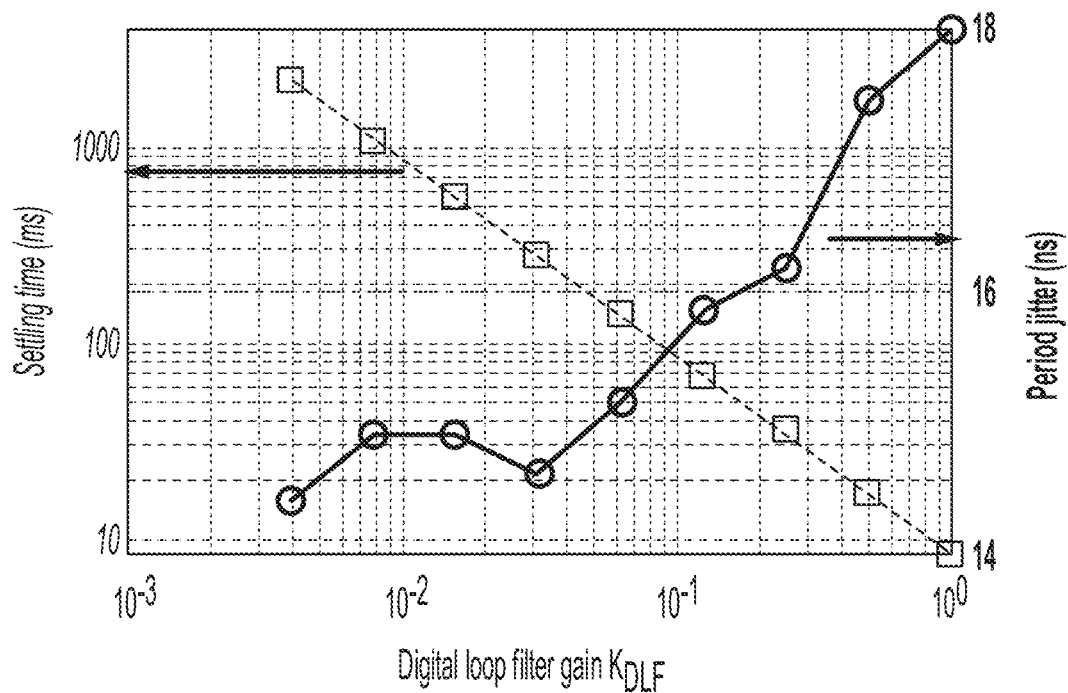
FIG. 8 illustrates measured settling time and period jitter versus loop gain $K_{DLF}$, according to an example embodiment.
Figure 9A:
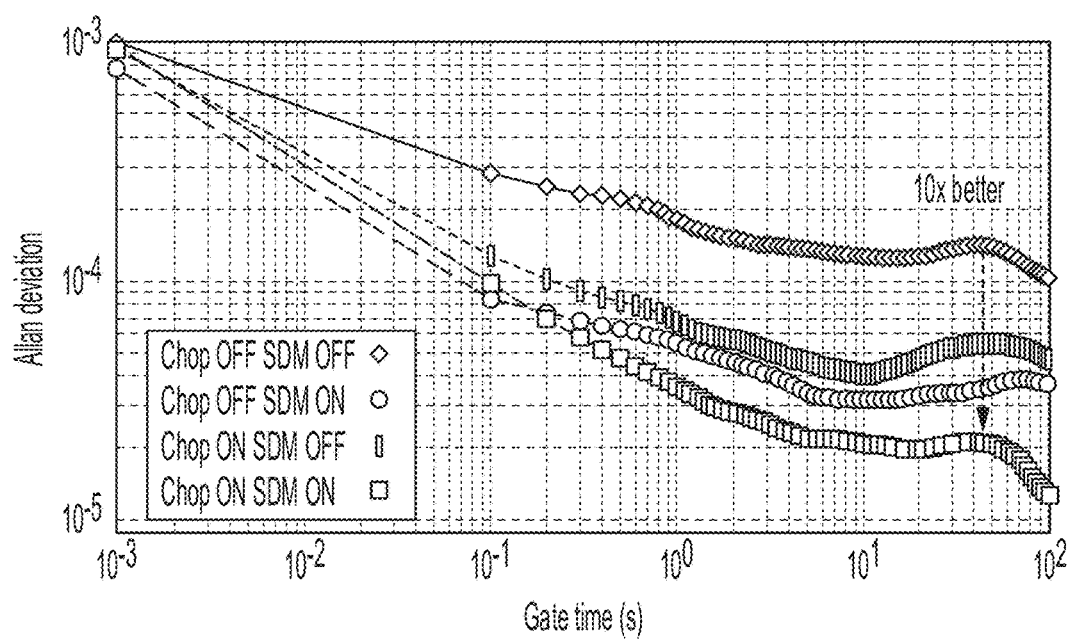
FIG. 9A illustrates measured long-term stability, according to an example embodiment.
Figure 9B:
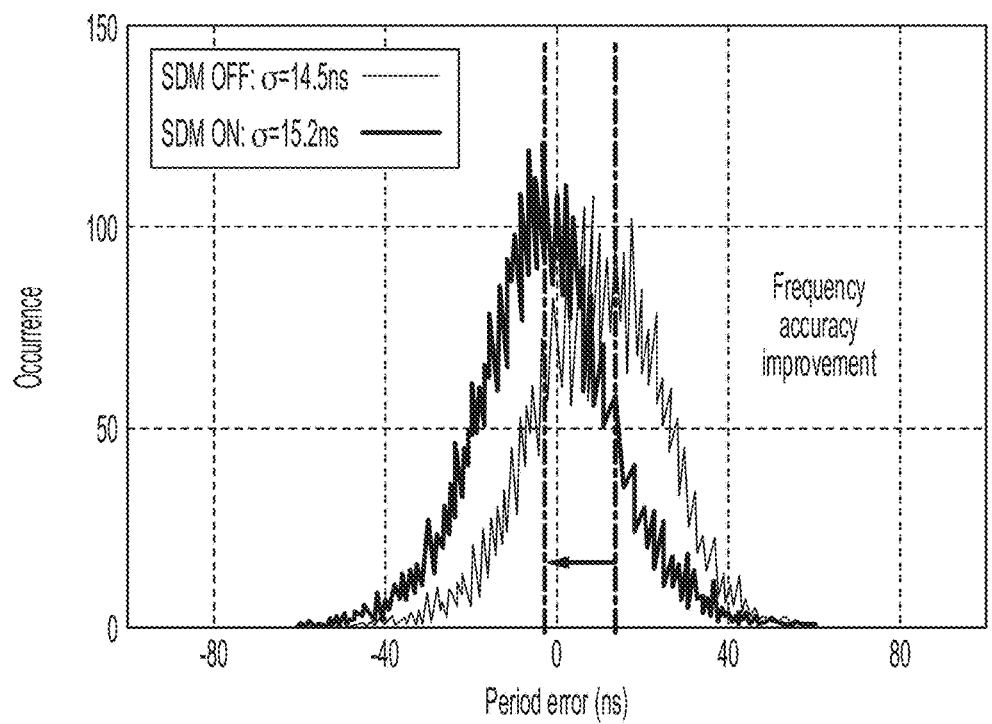
FIG. 9B illustrates measured period jitter, according to an example embodiment.
Figure 10:
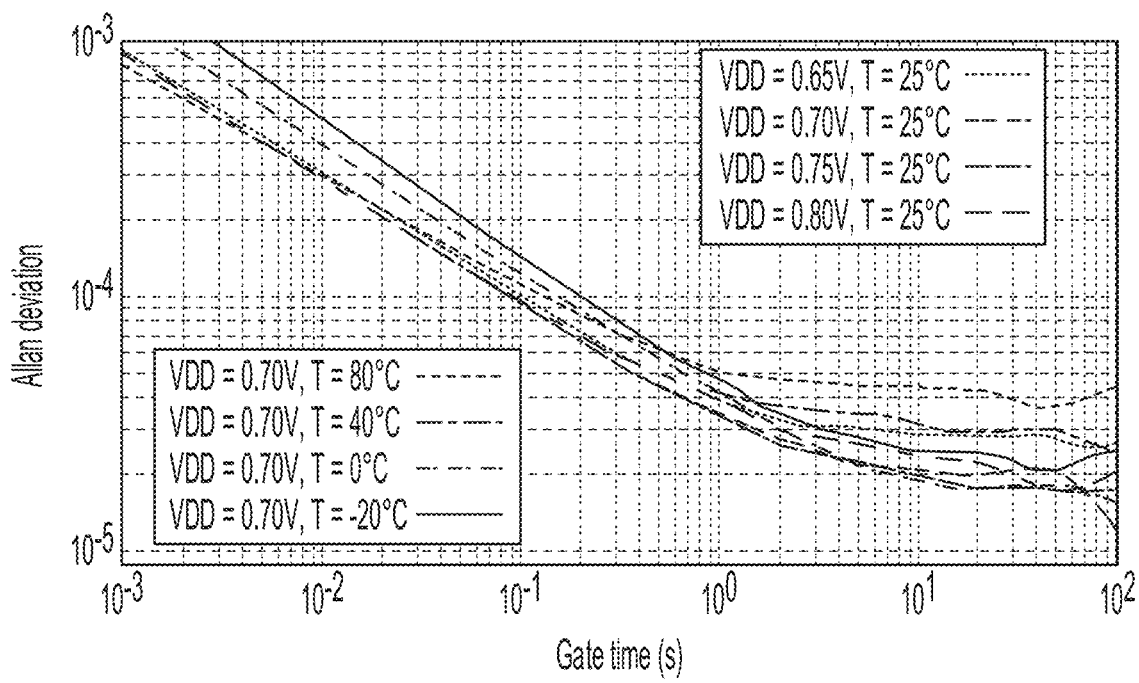
FIG. 10 illustrates measured long-term stability for various supply voltage and temperature operating conditions, according to example embodiments.
Figure 11A:
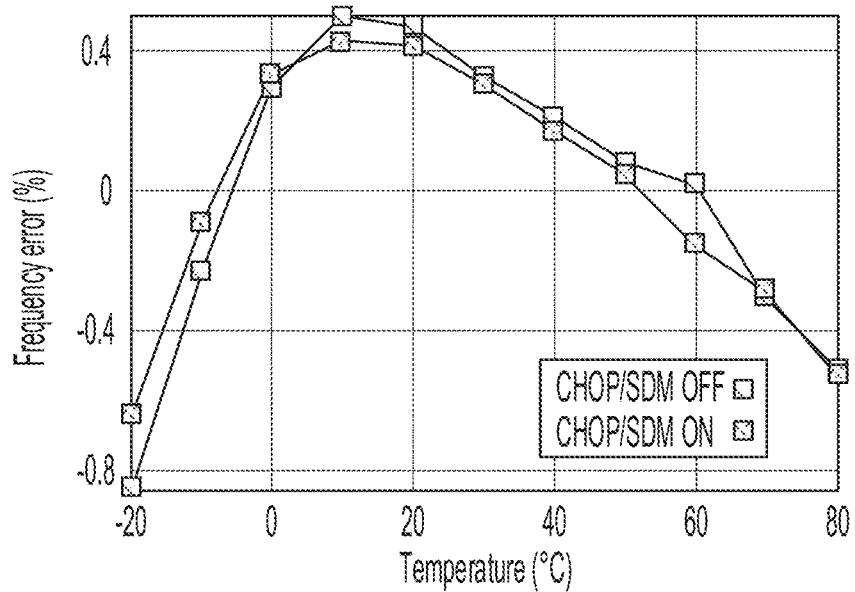
FIG. 11A illustrates frequency error versus on temperature, according to an example embodiment.
Figure 11B:
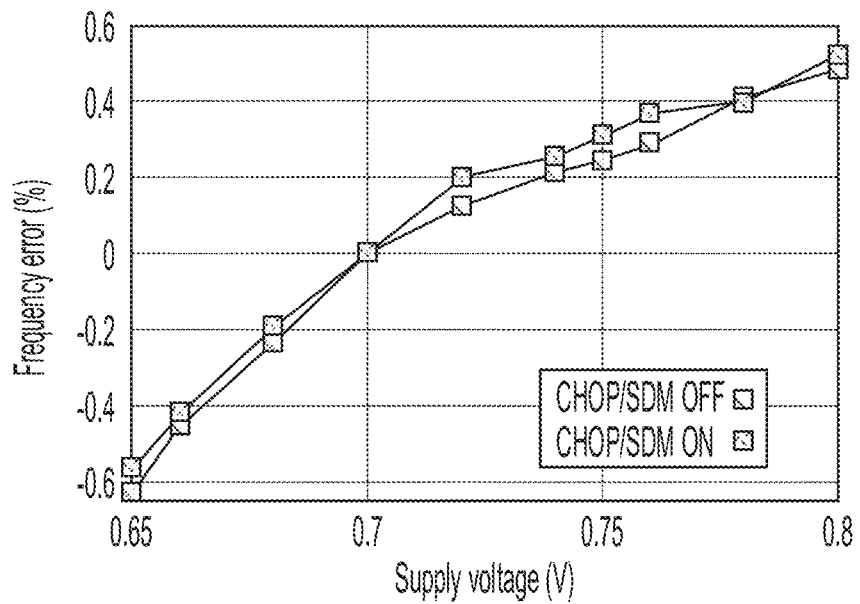
FIG. 11B illustrates frequency error versus supply voltage, according to an example embodiment.

Once enabled, due to the bang-bang operation, the frequency of the DFLL increments or decrements towards the steady-state frequency (FIG. 7(a)). The locking of the FLL can be observed in FIG. 7(a), in which the DCO output frequency in open-loop and closed loop configuration are compared. Although long-term stability is one of the critical performance metrics for wakeup timers, it is interesting to observe that, thanks to the digital-intensive nature of the architecture, the settling time can be easily configured and traded off for jitter, if required by the target application. This can be accomplished by tuning the digital loop-filter gain $K_{DLF}$ (FIG. 8). The period jitter is 15.2 $ns_{rms}$ and slightly improves (14.5 $ns_{rms}$) disabling the ΣΔ modulation and hence its quantization noise. Thanks to the self-clocked ΣΔ and the chopped comparator, the long-term stability (Allan deviation floor) improves by 10× down to 12 ppm beyond 100 s integration time (FIG. 9(a)). The long-term stability is relatively stable against temperature and supply voltage variations (FIG. 10). The temperature sensitivity of the output frequency improves from 134 ppm/° C. to 106 ppm/° C. when activating the chopping and the ΣΔ modulation, thanks to smaller errors due to a smaller DCO step and the mitigation of comparators offset (FIG. 11). The timer operates over the 0.65-0.8-V supply range with a deviation of ±0.6% (FIG. 11).

Although such temperature and supply sensitivity are sufficient for typical IoT applications and are on par with state-of-the-art designs (FIG. 12), simulations shows that they are limited by the on-resistance of the FD switches at such low supply and can be improved by proper re-design.

The performance is summarized and compared with other sub-µW state-of-the-art designs in FIG. 12. Being integrated in the most advanced CMOS process (40 nm) among nW timers to show its scaling advantages, the presented timer achieves the best power efficiency at the lowest operating supply voltage among state-of-the-art sub-µW timing references.

CONCLUSION

An ultra-low-power wakeup timer employing a bang-bang digital-intensive frequency-locked loop has been integrated in a 40-nm CMOS process. Thanks to the highly digital architecture, this timer achieves the best power efficiency (0.43 pJ/cycle) at an extremely low-supply voltage and in a low area, while keeping on-par long-term stability and on-par stability over supply and temperature variations. This demonstrates that the proposed architecture is suitable for IoT applications requiring accurate ultra-low-power timers integrated in advanced CMOS processes.

While the disclosure has been illustrated and described in detail in the drawings and foregoing description, such illustration and description are to be considered illustrative or exemplary and not restrictive. Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

What is claimed is:

1. A system comprising:
   a bang-bang frequency detector;
   a digital loop filter;
   a digitally-controlled oscillator (DCO); and
   a multi-phase clock generator, wherein an output of the bang-bang frequency detector is provided to an input of the digital loop filter, wherein an output of the digital loop filter is provided to the DCO, wherein an output of the DCO comprises information indicative of an output frequency, and wherein the multi-phase clock generator provides respective clock signals based on the output frequency to the bang-bang frequency detector, the digital loop filter, and the DCO.

2. The system of claim 1, further comprising a substrate, wherein the bang-bang frequency detector, the digital loop filter, the DCO, and the multi-phase clock generator are disposed on the substrate.

3. The system of claim 2, wherein the substrate comprises an area less than 0.07 $mm^2$.

4. The system of claim 1, wherein the bang-bang frequency detector, the digital loop filter, the DCO, and the multi-phase clock generator are provided according to a 40-nm CMOS manufacturing process.

5. The system of claim 1, wherein the bang-bang frequency detector, the digital loop filter, the DCO, and the multi-phase clock generator are configured to operate at a supply voltage of 0.7 volts or less.

6. The system of claim 1, further comprising a dynamic comparator, wherein the dynamic comparator is configured to provide a single bit output to the digital loop filter.

7. The system of claim 1, wherein the digital loop filter comprises a digital accumulator, wherein the digital loop filter is configured with an adjustable gain $K_{DLF}$.

8. The system of claim 1, wherein the DCO comprises a third-order sigma-delta modulator operating at $f_{res}$<250 Hz.

9. The system of claim 1, wherein the DCO comprises:
   a digital-to-analog converter (DAC); and
   a frequency generator.

10. The system of claim 1, wherein, during operation, the system uses less than 0.43 pJ/cycle.

11. The system of claim 1, wherein, during operation, an Allan deviation is less than 20 ppm at 100 s.

12. A system comprising:
   a bang-bang frequency detector;
   a digital loop filter;
   a digitally-controlled oscillator (DCO); and
   a multi-phase clock generator, wherein an output of the bang-bang frequency detector is provided to an input of the digital loop filter, wherein an output of the digital loop filter is provided to the DCO, wherein an output of the DCO comprises information indicative of an output frequency, wherein the multi-phase clock generator provides respective clock signals based on the output frequency to the bang-bang frequency detector, the digital loop filter, and the DCO, wherein the multi-phase clock generator provides a clock signal with frequency, $f_{clk}$, to the bang-bang frequency detector, wherein $f_{clk}$ is an integer multiple of the output frequency.

13. The system of claim 12, wherein $f_{clk}$ is at least 32 times the output frequency.

14. The system of claim 12, wherein the DCO comprises a third-order sigma-delta modulator, wherein the integer multiple is selected so as to provide an oversampled sigma-delta modulator, thereby improving a resolution of the DCO.

15. The system of claim 12, wherein the integer multiple is selected so as to improve stability of the system.

16. The system of claim 12, further comprising a substrate, wherein the bang-bang frequency detector, the digital loop filter, the DCO, and the multi-phase clock generator are disposed on the substrate.

17. The system of claim 16, wherein the substrate comprises an area less than 0.07 mm$^2$.

18. The system of claim 12, wherein the DCO comprises:
   a digital-to-analog converter (DAC); and
   a frequency generator.

19. The system of claim 12, wherein, during operation, the system uses less than 0.43 pJ/cycle.

20. The system of claim 12, wherein, during operation, an Allan deviation is less than 20 ppm at 100 s.

* * * * *